(12) United States Patent
Lai et al.

(10) Patent No.: US 12,477,834 B2
(45) Date of Patent: Nov. 18, 2025

(54) SEMICONDUCTOR DEVICE WITH A CLAMPING DIODE

(71) Applicant: NEXPERIA B.V., Nijmegen (NL)

(72) Inventors: Yan Lai, Nijmegen (NL); Phil Rutter, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 479 days.

(21) Appl. No.: 17/963,389

(22) Filed: Oct. 11, 2022

(65) Prior Publication Data

US 2023/0115609 A1   Apr. 13, 2023

(30) Foreign Application Priority Data

Oct. 11, 2021 (EP) .................................. 21201930

(51) Int. Cl.
*H10D 89/60* (2025.01)
(52) U.S. Cl.
CPC .................................. *H10D 89/611* (2025.01)
(58) Field of Classification Search
CPC ............... H10D 89/611; H10D 84/141; H10D 30/0291; H10D 84/144
See application file for complete search history.

(56) References Cited

U.S. PATENT DOCUMENTS

| 5,856,702 | A | 1/1999 | Hashimoto |
| 2004/0185622 | A1 | 9/2004 | Williams et al. |
| 2008/0290407 | A1 | 11/2008 | Kusunoki et al. |
| 2013/0075089 | A1 | 3/2013 | Hsieh |
| 2020/0227548 | A1* | 7/2020 | Lai ........................ H10D 84/144 |

FOREIGN PATENT DOCUMENTS

| EP | 1761953 A1 | 3/2007 |
| EP | 3664136 A1 | 6/2020 |
| WO | 2006011882 A1 | 2/2006 |

OTHER PUBLICATIONS

Extended European Search Report for corresponding European application EP21188591.8, 8 pages dated Jan. 14, 2022.
H. Muro, T.Mitamura and S. Kiyota: "Determination of Electrical Properties of n-Type and p-Type Polycrystalline Silicon Thin Films as Sensor Materials",Sensors and Materials, vol. 18, No. 8(2006) Dec. 7, 2006 (Dec. 7, 2006), pp. 433-444, XP055903293,MYU Tokyo; Retrieved from the Internet: URL:https://myukk.org/SM2017/sm_pdf/SM661.pdf [retrieved on Mar. 21, 2022].

* cited by examiner

*Primary Examiner* — Wasiul Haider
(74) *Attorney, Agent, or Firm* — Ruggiero McAllister & McMahon LLC

(57) ABSTRACT

This disclosure relates to a semiconductor device, and associated method of manufacture. The semiconductor device includes, a MOSFET integrated with a p-n junction, the p-n junction arranged as a clamping diode across a source contact and a drain contact of the MOSFET. The MOSFET defines a first breakdown voltage, and the clamping diode defines a second breakdown voltage, and the first breakdown voltage is greater than the second breakdown voltage. A series resistance of the clamping diode includes a drift resistance and a clamping resistance, and the drift resistance is formed together with the clamping diode and the clamping resistance is formed independently from the clamping diode and configured to secure a uniform avalanche current.

12 Claims, 7 Drawing Sheets

SEMICONDUCTOR DEVICE WITH A CLAMPING DIODE

CROSS REFERENCE TO RELATED APPLICATION

This application claims the benefit under 35 U.S.C. § 119(a) of European Application No. 21201930.1 filed Oct. 11, 2021, the contents of which are incorporated by reference herein in their entirety.

BACKGROUND OF THE DISCLOSURE

1. Field of the Disclosure

The present disclosure relates to a semiconductor device. More particularly the present disclosure relates to a MOSFET semiconductor device with a clamping diode.

2. Description of the Related Art

MOSFET semiconductor devices may be used as switching devices. When in use such devices may undergo several switching events per second. A switching event is when the device turns on and then turns off. When a MOSFET device is turned off uncontrolled overshoots and voltage spikes may occur on the drain of the MOSFET device due to current changes over time and inductances in the device. As the number of switching events per second increases the voltage spikes observed on the drain can exceed the specification of the application, where a typical application would be where the magnitude of the voltage spike should not exceed 80-90% of voltage rating of the device, and/or exceed the breakdown voltage of the MOSFET device.

The breakdown voltage BV of a MOSFET device is the voltage at which the reverse biased body diode breaks down and a significant avalanche current starts to flow between the source and the drain of the device. In the case of multiple repetitive switching events, the MOSFET device may undergo repetitive avalanche events which may in turn cause device parameters, such as device on resistance, threshold voltage, drain-source leakage current, etc., to vary as a result of hot majority carrier injection into the active area of the MOSFET device during such avalanche events. Such a variation of MOSFET device parameters may result in a reduced functionality and/or reliability of the MOSFET device. In addition, the repetitive hot majority carrier injection may eventually cause the MOSFET device to fail. Therefore, preventing the active area of the MOSFET device from avalanching or reducing the time the active area undergoes avalanche will prevent MOSFET device parameters from changing or prevent a failure of the MOSFET device.

It is known to use so-called clamping diodes to prevent such an avalanche. As discussed in patent EP1761953 a Zener diode is used to clamp a drain-source voltage lower than the field plate induced breakdown voltage. Generally, such a clamping diode, connected between the drain and source of MOSFET device may prevent the active area of the MOSFET device from avalanching or reduce the time that the active area undergoes an avalanche event. However, this has a disadvantage of requiring a higher active area breakdown voltage which in-turn increases the resistance of the MOSFET device.

Other known arrangements rely on the use of parallel clamping diodes, but such arrangements are configured to operate for single event, high current, high avalanche pulses only, rather than single event, high current, high avalanche and also repetitive avalanche pulses.

SUMMARY

Various example embodiments are directed to issues such as those addressed above and/or other issues which may become apparent from the following disclosure concerning the operation of the MOSFET semiconductor device. In some example embodiments, aspects of the present disclosure involve the use of a MOSFET semiconductor device structure that is configured to secure an uniform avalanche current during repetitive avalanche pulses.

According to an embodiment of the disclosure a semiconductor device comprises a MOSFET integrated with a p-n junction, the p-n junction arranged as a clamping diode across a source contact and a drain contact of the MOSFET. The MOSFET defines a first breakdown voltage and the clamping diode defines a second breakdown voltage. The first breakdown voltage is greater than the second breakdown voltage. This can be achieved, for example, by the spacing between the deep tranches as well as the linear thickness and the doping.

A series resistance of the clamping diode comprises a drift resistance and a clamping resistance. According to an embodiment of this disclosure the drift resistance is formed together with the clamping diode, while the clamping resistance is formed independently from the clamping diode and configured to secure an uniform avalanche current. Securing an uniform avalanche current that is achieved by the means of this disclosure prevents the MOSFET semiconductor device parameters from changing and consequently prevents a failure of the MOSFET semiconductor device.

According to an embodiment of the disclosure, the clamping resistance comprises one or more deep trench structures.

According to an embodiment of the disclosure, the clamping resistance can be configured by a length of the deep trench structures and/or a width of the deep trench structures.

According to an embodiment of the disclosure, the polysilicon of the deep trench structures is heavily doped so that a variation of the clamping resistance with temperature is minimized.

According to an embodiment of the disclosure, the clamping diode comprises a first pad for the cathode of the clamping diode and a second pad for the anode of the clamping diode, so that the clamping diode can be used for the temperature sensing.

According to an embodiment of the disclosure, the drifting resistance comprises an intrinsic resistance of the clamping diode and a spreading resistance.

According to an embodiment of the disclosure, the MOSFET comprises a semiconductor substrate, an epitaxial layer formed on the semiconductor substrate, a body layer formed on the epitaxial layer and a plurality of spaced apart deep conductive trenches extending through the body layer and the epitaxial layer and extending into the semiconductor substrate. The semiconductor substrate and the epitaxial layer are formed of a first conductivity type, while the body layer is formed of a second conductivity type, opposite to the first conductivity type.

According to an embodiment of the disclosure, the spaced apart deep conductive trenches define a contact window of the body layer. The contact window is connected to at least one shallow conductive trench forming a first contact terminal of the p-n junction.

The disclosure also relates to a method of manufacturing a semiconductor device. The method comprises a step of forming a MOSFET integrated with a p-n junction, wherein the p-n junction arranged as a clamping diode across a source contact and a drain contact of the MOSFET. The MOSFET defines a first breakdown voltage and the clamping diode defines a second breakdown voltage, wherein the first breakdown voltage is greater than the second breakdown voltage. A series resistance of the clamping diode comprises a drift resistance and a clamping resistance. The drift resistance is formed together with the clamping diode, while the clamping resistance is formed independently from the clamping diode and configured to secure an uniform avalanche current. Securing an uniform avalanche current that is achieved by the means of this method prevents the MOSFET semiconductor device parameters from changing and consequently prevents a failure of the MOSFET semiconductor device.

According to an embodiment of the disclosure, the method described above further comprises steps:
providing a semiconductor substrate,
forming an epitaxial layer on the semiconductor substrate,
forming a body layer on the epitaxial layer, and
forming a plurality of spaced apart deep conductive trenches extending through the body layer and the epitaxial layer and extending into the semiconductor substrate.

The semiconductor substrate and the epitaxial layer are formed of a first material of a first conductivity type, while the body layer is formed of a second material of a second conductivity type which is opposite to the first conductivity type.

According to an embodiment of the disclosure, the method described above further comprises steps:
defining a contact window of the body layer between the spaced apart deep conductive trenches, and
connecting the contact window to at least one shallow conductive trench to form a first contact terminal of the p-n junction.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

Figure 1A:
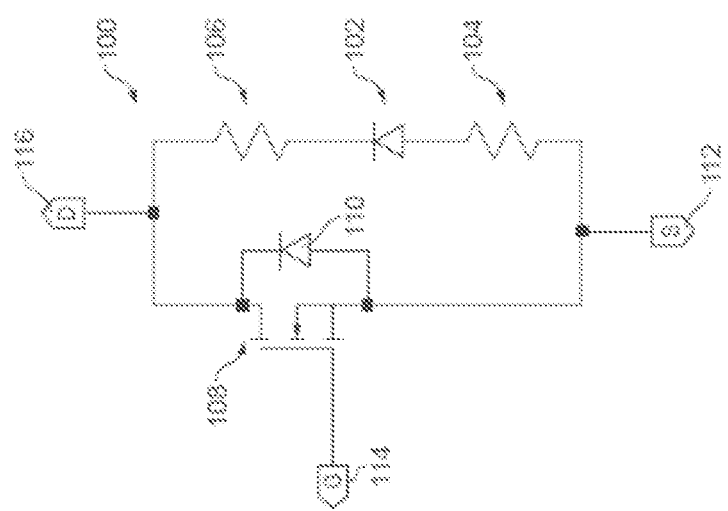
FIG. 1A illustrates a MOSFET semiconductor device in accordance with an embodiment of the present disclosure.

An embodiment of this disclosure is shown in FIGS. 1A-1E. A MOSFET semiconductor device 100 comprises a source 112, a gate 114 and a drain 116 contacts. These contacts are connected to a MOSFET active area 108, and a clamp circuit.

The clamp circuit comprises a clamping diode 102. A breakdown voltage of the clamping diode 102 is adjusted to be lower than the breakdown voltage of the MOSFET semiconductor device 100, which can be achieved for example by the spacing between the deep tranches as well as the linear thickness and the doping.

The clamping diode has an anode 126 and a cathode 128. A series resistance of the clamping diode 102 comprises a drift resistance 106 and a clamping resistance 104. According to an embodiment of this disclosure the drift resistance 106 is formed together with the clamping diode 102. The clamping resistance 104 is formed independently from the clamping diode 102. Such a clamping resistance 104 is configured to secure an uniform avalanche current. The the breakdown voltage of the MOSFET semiconductor device 100 is a voltage at which an inherent body diode 110 breaks down and a significant avalanche current starts to flow between the source 112 and drain 116 of the MOSFET semiconductor device 100. During the operation of the MOSFET semiconductor device 100 multiple repetitive switching events are possible, and in this case repetitive avalanche events can be caused. These repetitive avalanche events can trigger a change of the MOSFET semiconductor device 100 parameters, e.g. a device on resistance, a threshold voltage, a drain-source leakage current, etc. The variation in the MOSFET semiconductor device 100 parameters may result in a reduced device functionality and/or reliability. The related repetitive hot majority carrier injection may eventually cause the MOSFET semiconductor device 100 to fail. Securing an uniform avalanche current that is achieved by the means of this disclosure prevents the MOSFET semiconductor device 100 parameters from changing and consequently prevents a failure of the MOSFET semiconductor device 100.

As shown in FIG. 1A, the clamping resistance 104 arranged in parallel across the source 112 and drain 116 contacts of the MOSFET semiconductor device 100. The drift resistance 106 of the clamping diode 102 is associated with an inherent body diode 110 of the active area 108 across the source 112 and drain 116 contacts of the MOSFET semiconductor device 100.

The drift resistance 106 is formed at the same time when the clamping diode 102 is formed. The drift resistance comprises of an intrinsic resistance of a p-n junction diode 130, illustrated in FIG. 1E and a spreading resistance into the drift region. The drift resistance refers to the resistance of the vertical portion of the clamping diode 102 underneath the diode contact.

Figure 1B:
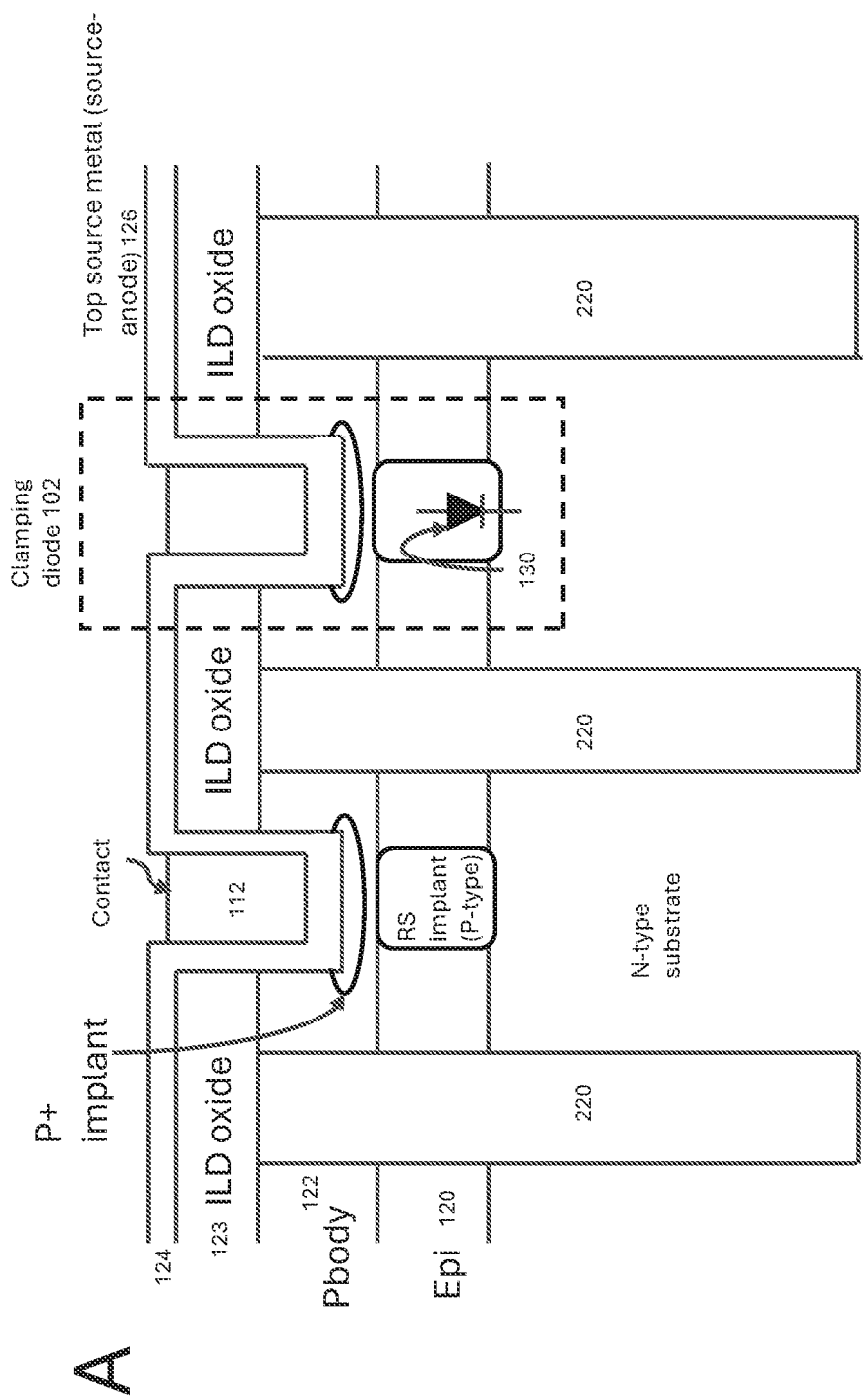
FIG. 1B illustrates a MOSFET semiconductor device in accordance with an embodiment of the present disclosure.
Figure 1C:
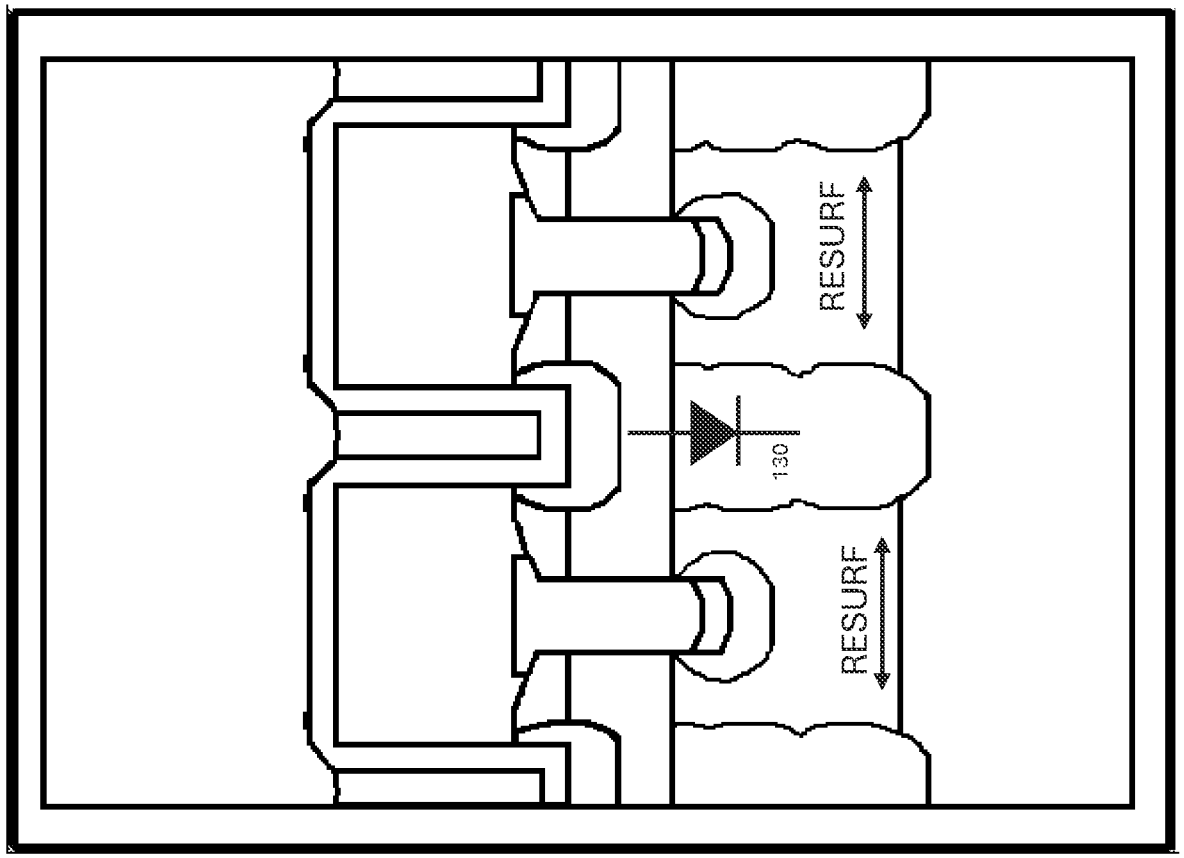
FIG. 1C illustrates a MOSFET semiconductor device in accordance with an embodiment of the present disclosure.
Figure 1D:
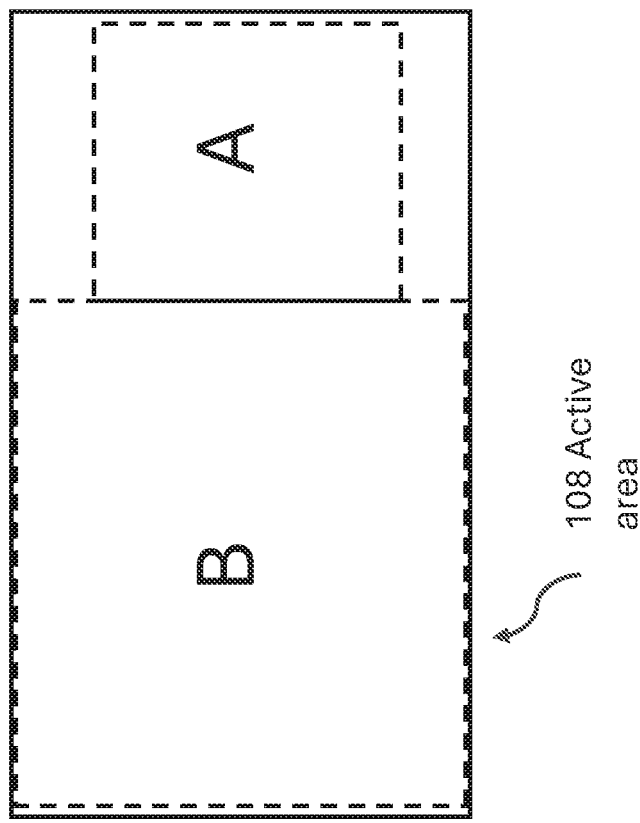
FIG. 1D illustrates an active area of MOSFET semiconductor device in accordance with an embodiment of the present disclosure.
Figure 1E:
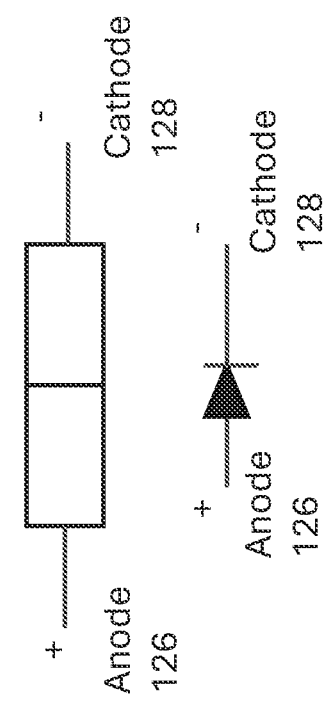
FIG. 1E illustrates a p-n junction diode of a clamping diode for a MOSFET semiconductor device in accordance with an embodiment of the present disclosure.

As illustrated in FIG. 1B, the MOSFET semiconductor device 100 may comprise a substrate 118, an epitaxial layer 120 formed on the substrate 118, which may form a drift region. The epitaxial layer 120 may be a silicon epitaxial layer 120. The MOSFET semiconductor device 100 may further comprise a body layer 122 that is formed on the epitaxial silicon layer 120. An insulating layer 123 may be provided on the body layer 122 and a conductive layer 124 may be provided on the insulating layer. The conductive layer 124 may form the source contact 112 of the MOSFET semiconductor device 100. The substrate 118 may be a doped substrate 118.

The substrate 118 and the epitaxial silicon layer 120 can be formed as n-type layers and the body layer 122 can be formed as a p-type layer. The body layer 122 may be formed by way of an appropriate implant into the epitaxial silicon layer 120.

Figure 2:
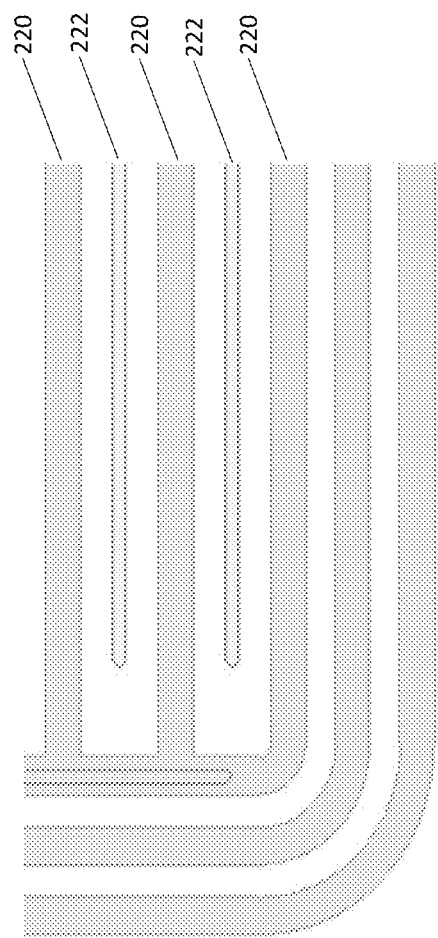
FIG. 2 illustrates a top view of a MOSFET semiconductor device, in accordance with an embodiment of the present disclosure.

As illustrated in FIG. 2, clamping diode 102 comprises a long stripe 222 between the deep trenches 220. In this way one single diode 130 or only a few diodes can be used for one device instead of a network of many diodes.

The deep trenches 220 extend from between portions of the body layer 122 into, and terminate in, the doped substrate 118. Alternatively, the deep trenches 220 may extend into and terminate in the epitaxial silicon layer 120. The deep trenches 220 may be lined with an insulating material and then filled with a conductive material. A first set of shallow source trenches extend through the insulating layer to the conductive material of the deep trenches. The shallow source trenches are filled with a conductive material to form source contacts 112. The conductive material of the source contacts 112 couples the conductive layer 124 to the conductive material of the deep trenches. A second set of shallow trenches extend through the insulating layer and terminate in the body layer 122. Each of the second set of shallow trenches are arranged in contact windows between the each of the deep trenches and are filled with a conductive material to couple the conductive layer 124 to the body layer 122.

The first set of shallow source trenches and the second set of shallow source trenches may be formed simultaneously. Alternatively, they may be formed during separate processes. Likewise, the conductive materials are formed from the same material and, furthermore the conductive materials may be formed simultaneously to the formation of the conductive layer 124. In this way the conductive materials and the conductive layer 124 may be formed from the same material.

The arrangement of the second set of shallow trenches forms the clamping diode 102 illustrated in FIGS. 1A-1B. The conductive materials may be the same material and advantageously may be formed in the same process step.

The anode 126 of the clamping diode 102 can be formed using the second set of shallow source trenches by coupling the conductive material to a p-type body layer 122. The cathode 128 of the clamping diode 102 is formed by the substrate 118 and the epitaxial silicon layer 120 with an appropriate drain contact formed on the substrate 118. Therefore, a p-n junction 130 of the clamping diode 102 is formed by the p-type body layer 122 and the substrate 118 and the epitaxial silicon layer 120 forming a drift region. In this regard the anode 126 of the clamping diode 102 is connected to the source 112 of the MOSFET semiconductor device by the electrical connection of the conductive layer 124 to the conductive material of the second set of shallow trenches. Likewise, the cathode 128 of the clamping diode 102 is connected to the drain 116 of the MOSFET semiconductor device so that the clamping diode 102 is connected in parallel across the source 112 and the drain 116. In this way, the clamping diode 102 and the drift resistance 106 is integrated on the die of the MOSFET semiconductor device 100, that is a vertical portion of the diode in the epitaxial silicon layer 120 and substrate 118.

An embodiment of the disclosure is shown in FIG. 2. This is a top view of the structure of the MOSFET semiconductor device 100. The MOSFET semiconductor device 100 comprises a network of interconnected deep trenches 220 extending between portions of the body layer 122 into the doped substrate 118. The deep trenches 220 may be lined with an insulating material and then filled with conductive material and the conductive material of the deep trenches is contacted to the first set of shallow source trenches filled with a conductive material, thus forming the source contacts 112. The second set of shallow trenches are arranged in the contact windows between the each of the deep trenches and are filled with a conductive material to form the anode contact 124a of the clamping diode 102 to the underlying body layer 122. Each contact window, also known as the diode region, may contain multiple, spaced apart, anode contacts 126a of the clamping diode.

An appropriate edge termination structure may be provided around the periphery of the MOSFET semiconductor device 100 as understood by the skilled person. The skilled person will also appreciate that the edge termination structure may be formed by any appropriate structure such as an edge trench or combination of edge trenches.

Consequently, where the MOSFET semiconductor device 100 according to embodiments undergoes multiple repetitive switching events, securing an uniform avalanche current that is achieved by the means of this disclosure prevents the MOSFET semiconductor device 100 parameters from changing and consequently prevents a failure of the MOSFET semiconductor device 100.

The MOSFET semiconductor device can be a n-channel MOSFET semiconductor device, however the skilled person will appreciate that the arrangements of the present disclosure are equally applicable to a p-channel MOSFET semiconductor devices. For example, the MOSFET semiconductor device may comprise a p-type substrate, a p-type epitaxial silicon layer and an n-type body layer.

Figure 3:
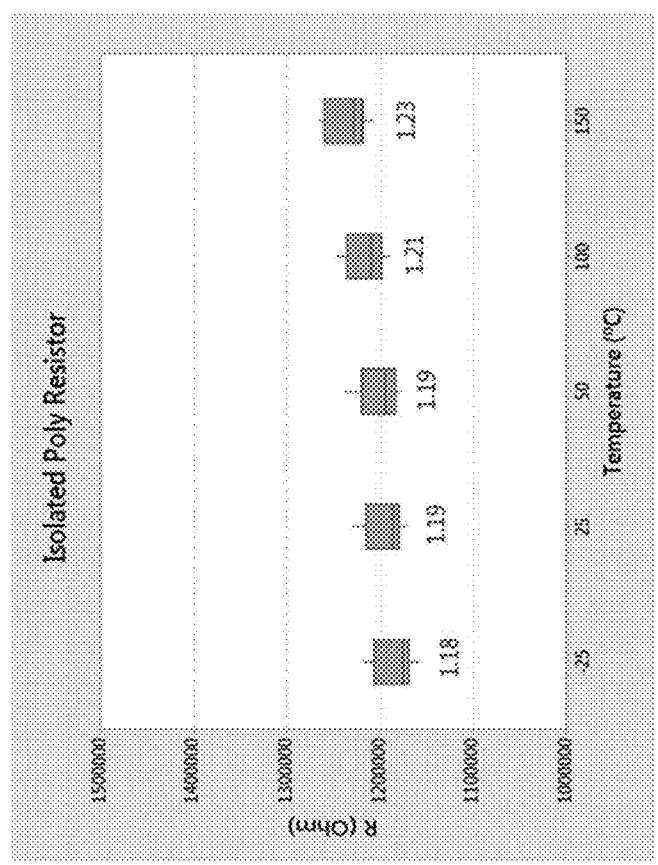
FIG. 3 illustrates shows a variation of a clamping resistance formed by deep trenches with temperature according to an embodiment of the present disclosure.

As shown in FIG. 3, when the polysilicon of deep trench 220 is heavily doped to certain extent, the clamping resistance formed by deep trenches has very little variation with temperature. In an embodiment of the disclosure, separate contact pads can be designed for the cathode and anode 126 of the clamping diode, so that the clamping diode is used for temperature sensing.

Aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device, comprising:
   a MOSFET integrated with a p-n junction, the p-n junction arranged as a clamping diode across a source contact and a drain contact of the MOSFET;
   wherein the MOSFET defines a first breakdown voltage and the clamping diode defines a second breakdown voltage;
   wherein the first breakdown voltage is greater than the second breakdown voltage;
   wherein the clamping diode has a series resistance that comprises a drift resistance and a clamping resistance;
   wherein the drift resistance is formed together with the clamping diode;
   wherein the clamping resistance is formed independently from the clamping diode and configured to secure a uniform avalanche current, and
   wherein the clamping resistance comprises one or more deep trench structures that include a heavily doped polysilicon configured to minimize a variation of the clamping resistance with temperature.

2. The semiconductor device as claimed in claim 1, wherein the clamping diode comprises a first pad for the cathode of the clamping diode and a second pad for the anode of the clamping diode, so that the clamping diode can be used for the temperature sensing.

3. The semiconductor device as claimed in claim 1, wherein the drifting resistance comprises an intrinsic resistance of the clamping diode and a spreading resistance.

4. The semiconductor device as claimed in claim 1, wherein the MOSFET comprises:
   a semiconductor substrate;
   an epitaxial layer formed on the semiconductor substrate;
   a body layer formed on the epitaxial layer; and
   a plurality of the one or more deep trench structures extending through the body layer and the epitaxial layer and extending into the semiconductor substrate;
   wherein the semiconductor substrate and the epitaxial layer are formed of a first conductivity type; and
   wherein the body layer is formed of a second conductivity type opposite to the first conductivity type.

5. The semiconductor device as claimed in claim 4, wherein the spaced apart deep conductive trenches define a contact window of the body layer; and
   wherein the contact window is connected to at least one shallow conductive trench forming a first contact terminal of the p-n junction.

6. The semiconductor device as claimed in claim 1, wherein the clamping resistance is configured by a length of the one or more deep trench structures and/or a width of the one or more deep trench structures.

7. The semiconductor device as claimed in claim 6, wherein the clamping diode comprises a first pad for the cathode of the clamping diode and a second pad for the anode of the clamping diode, so that the clamping diode can be used for the temperature sensing.

8. The semiconductor device as claimed in claim 6, wherein the drifting resistance comprises an intrinsic resistance of the clamping diode and a spreading resistance.

9. The semiconductor device as claimed in claim 1, wherein the clamping diode comprises a first pad for the cathode of the clamping diode and a second pad for the anode of the clamping diode, so that the clamping diode can be used for the temperature sensing.

10. The semiconductor device as claimed in claim 1, wherein the drifting resistance comprises an intrinsic resistance of the clamping diode and a spreading resistance.

11. A method of manufacturing a semiconductor device, comprising the steps of:
    providing a semiconductor substrate;
    forming an epitaxial layer on the semiconductor substrate;
    forming a body layer on the epitaxial layer;
    forming a plurality of spaced apart deep conductive trenches extending through the body layer and the epitaxial layer and extending into the semiconductor substrate and providing the plurality of spaced apart deep conductive trenches with a heavily doped polysilicon;
    wherein the semiconductor substrate and the epitaxial layer are formed of a first conductivity type; and
    wherein the body layer is formed of a second conductivity type opposite to the first conductivity type,
    forming a MOSFET integrated with a p-n junction, the p-n junction arranged as a clamping diode across a source contact and a drain contact of the MOSFET;
    wherein the MOSFET defines a first breakdown voltage and the clamping diode defines a second breakdown voltage;
    wherein the first breakdown voltage is greater than the second breakdown voltage;
    wherein the clamping diode has a series resistance that comprises a drift resistance and a clamping resistance;
    wherein the drift resistance is formed together with the clamping diode;
    wherein the clamping resistance is formed independently from the clamping diode and configured to secure a uniform avalanche current; and
    wherein the clamping resistance comprises the plurality of deep trench structures that include the heavily doped polysilicon configured to minimize a variation of the clamping resistance with temperature.

12. The method as claimed in claim 11, further comprising the steps of:
    defining a contact window of the body layer between the plurality of deep conductive trenches; and
    connecting the contact window to at least one shallow conductive trench to form a first contact terminal of the p-n junction.

* * * * *